(12) United States Patent
Kato et al.

(10) Patent No.: US 6,320,383 B1
(45) Date of Patent: Nov. 20, 2001

(54) RF COIL, RF MAGNETIC FIELD GENERATING APPARATUS AND MAGNETIC RESONANCE IMAGING METHOD AND APPARATUS

(75) Inventors: Yasushi Kato; Tetsuo Ogino; Yukitoshi Shimo, all of Tokyo (JP)

(73) Assignee: GE Yokogawa Medical Systems, Limited, Tokyo (JP)

( * ) Notice: Subject to any disclaimer, the term of this patent is extended or adjusted under 35 U.S.C. 154(b) by 0 days.

(21) Appl. No.: 09/484,833

(22) Filed: Jan. 18, 2000

(51) Int. Cl.[7] .................................................. G01V 3/00
(52) U.S. Cl. ........................ 324/318; 324/309; 324/322
(58) Field of Search .................................. 324/318, 309, 324/322, 307, 311

(56) References Cited

FOREIGN PATENT DOCUMENTS 6051044    2/1994   (JP) .

OTHER PUBLICATIONS

I.Viohl 'circular polarized RF coils for Open Magnet Systems, Proceedings of Soc. of Mag.Reson, Nice France, Aug. 19–25, 1995, vol. 1, p. 183.
Patent Abstracts of Japan. Vo. 18, No. 281 (May 27, 1994).
EB BoskamP; "Vertical field Open RF body coils", Proceedings of the Int.Soc. for Mag. Reson. in Medicine, May 22–28, 1999; Vo. 1, p. 736.
Japan Patent Abstract, Publ.No. 08/280652, (Oct. 29, 1996).

Primary Examiner—Hezron Williams
Assistant Examiner—Brij B. Shrivastav
(74) Attorney, Agent, or Firm—Moonray Kojima

(57) ABSTRACT

In order to provide a good frequency property and good openness of a magnetic field space, there is provided a quadrature RF coil and RF magnetic field generating apparatus that comprises two RF coils facing each other, each of the RF coils comprising an annular closed loop 602 and a plurality of radial electric paths 604 inside the closed loop 602, and generates an RF magnetic field by quadrature-driving the two RF coils, and a magnetic, resonance imaging method and apparatus employing such an RF magnetic field generating apparatus.

20 Claims, 10 Drawing Sheets

Direction of RF magnetic field

Direction of RF magnetic field

RF COIL, RF MAGNETIC FIELD GENERATING APPARATUS AND MAGNETIC RESONANCE IMAGING METHOD AND APPARATUS

BACKGROUND OF THE INVENTION

The present invention relates to an RF (radio frequency) coil, RF magnetic field generating apparatus and magnetic resonance imaging method and apparatus, and more particularly to an RF coil and RF magnetic field generating apparatus that generates an RF magnetic field in a direction parallel to the coil loop surface, and a magnetic resonance imaging method and apparatus employing such an RF magnetic field generating apparatus.

A magnetic resonance imaging apparatus with a static magnetic field direction perpendicular to the body axis of a subject, commonly referred to as a vertical magnetic field-type magnetic resonance imaging apparatus, generates an open static magnetic field space, and hence employs as an RF coil for generating the RF magnetic field an RF coil having a loop surface parallel to the pole piece surface of a static magnetic field generating unit. The RF coil of this type generates the RF magnetic field in the direction parallel to the coil loop surface to form the RF magnetic field perpendicular to the static magnetic field direction. Such an RF coil is disclosed in U.S. Pat. No. 5,760,583 of the present applicant.

On the other hand, there is another type of an RF coil referred to as a quadrature RF coil, which consists of a combination of two RF coils, and can provide an RF magnetic field having an increased strength through vector composition of respective RF magnetic fields generated by the two RF coils or can reduce a drive power per coil to generate the RF magnetic field of a desired strength.

SUMMARY OF THE INVENTION

It is an object of the invention to provide a quadrature RF coil and RF magnetic field generating apparatus having a good frequency property and good openness of a magnetic field space, and a magnetic resonance imaging method and apparatus employing such an RF magnetic field generating apparatus.

In accordance with a first aspect of the invention, there is provided an RF coil comprising: a first electric path forming an annular closed loop; a plurality of second electric paths radially extending from a common connecting portion to the first electric path, the common connecting portion lying inside the closed loop formed by the first electric path; a third electric path facing the first electric path at a distance and forming an annular closed loop parallel to the closed loop of the first electric path; and a plurality of fourth electric paths radially extending from a common connecting portion to the third electric path, the common connecting portion lying inside the closed loop formed by the third electric path.

In accordance with a second aspect of the invention, there is provided an RF magnetic field generating apparatus comprising: a first electric path forming an annular closed loop; a plurality of second electric paths radially extending from a common connecting portion to the first electric path, the common connecting portion lying inside the closed loop formed by the first electric path; a third electric path facing the first electric path at a distance and forming an annular closed loop parallel to the closed loop of the first electric path; a plurality of fourth electric paths radially extending from a common connecting portion to the third electric path, the common connecting portion lying inside the closed loop formed by the third electric path; and an-RF signal supply means for supplying RF signals respectively to first positions each lying at relatively the same location on the first and third electric paths, and supplying RF signals having a phase different from that of the RF signals to the first positions by 90° respectively to second positions each lying at relatively the same location on the first and third electric paths and 90° apart from the first positions with respect to the direction as viewed from the central portion of the closed loop of the first or third electric path.

In accordance with a third aspect of the invention, there is provided a magnetic resonance imaging method comprising the steps of generating a static magnetic field in a z-direction, wherein three mutually orthogonal directions are defined as an x-direction, a y-direction and a z-direction in a space accommodating a subject under study, generating a gradient magnetic field in the space, generating a high frequency magnetic field in the space, measuring a magnetic resonance signal from the space, and producing an image based on the measured magnetic resonance signal, wherein the step of generating the high frequency magnetic field is performed using: a first electric path forming an annular closed loop in a plane perpendicular to the z-direction; a plurality of second electric paths radially extending from a common connecting portion to the first electric path, the common connecting portion lying inside the closed loop formed by the first electric path; a third electric path facing the first electric path at a distance in the z-direction and forming an annular closed loop parallel to the closed loop of the first electric path; a plurality of fourth electric paths radially extending from a common connecting portion to the third electric path, the common connecting portion lying inside the closed loop formed by the third electric path; and an RF signal supply means for supplying RF signals respectively to first positions each lying at relatively the same location on the first and third electric paths, and supplying RF signals having a phase different from that of the RF signals to the first positions by 90° respectively to second positions each lying at relatively the same location on the first and third electric paths and 90° apart from the first positions with respect to the direction as viewed from the central portion of the closed loop of the first or third electric path.

In accordance with a fourth aspect of the invention, there is provided a magnetic resonance imaging apparatus comprising: static magnetic field generating means for generating a static magnetic field in a z-direction, wherein three mutually orthogonal directions are defined as an x-direction, a y-direction and a z-direction in a space accommodating a subject under study; gradient magnetic field generating means for generating a gradient magnetic field in the space; high frequency magnetic field generating means for generating a high frequency magnetic field in the space; measuring means for measuring a magnetic resonance signal from the space; and image producing means for producing an image based on the magnetic resonance signal measured by the measuring means, wherein the high frequency magnetic field generating means comprises: a first electric path forming an annular closed loop in a plane perpendicular to the z-direction; a plurality of second electric paths radially extending from a common connecting portion to the first electric path, the common connecting portion lying inside the closed loop formed by the first electric path; a third electric path facing the first electric path at a distance in the z-direction and forming an annular closed loop parallel to the closed loop of the first electric path; a plurality of fourth electric paths radially extending from a common connecting portion to the third electric path, the common connecting portion lying inside the closed loop formed by the third electric path; and an RF signal supply means for supplying RF signals respectively to first positions each lying at relatively the same location on the first and third electric paths, and supplying RF signals having a phase different from that of the RF signals to the first positions by 90° respectively to second positions each lying at relatively the same location on the first and third electric paths and 90° apart from the first positions with respect to the direction as viewed from the central portion of the closed loop of the first or third electric path.

In any one of the first through fourth aspects of the invention, it is preferred that the first through fourth electric paths be made from a conductive foil, in that the homogeneity of the RF magnetic field strength distribution is improved.

Moreover, in any one of the first through fourth aspects of the invention, it is preferred that the common connecting portion have a disk-like shape having no opening, in that the RF magnetic field strength distribution is made suitable.

Furthermore, in any one of the first through fourth aspects of the invention, it is preferred that the first and second electric paths be disposed on a first support plate of an insulating material, the third and fourth electric paths be disposed on a second support plate of an insulating material, and an associated electric circuit be provided within a thickness range of the first or second support plate between the second electric paths or between the fourth electric paths, in that an outer shape of the RF coil is simplified.

In this case, it is preferred that the associated electric circuit be a disable circuit, in that coupling with the other coil is prevented.

In addition, in any one of the second through fourth aspects of the invention, it is preferred that to the first positions, the RF signals be supplied from a common signal source via a first power splitter, and to the second positions, the RF signals be supplied from the common signal source via a second power splitter, in that the RF magnetic field is suitably generated.
(Operation)

In accordance with the present invention, an RF magnetic field is generated by quadrature-driving two coils facing each other with respective RF signals. Since there are no overlapping loops, coupling does not occur. Moreover, since the degree of freedom in leading RF signal supply lines to the coils is high, openness of the magnetic field space is not obstructed.

Thus, the present invention can provide a quadrature RF coil and RF magnetic field generating apparatus having a good frequency property and good openness of a magnetic field space, and a magnetic resonance imaging method and apparatus employing such an RF magnetic field generating apparatus.

Further objects and advantages of the present invention will be apparent from the following description of the preferred embodiments of the invention as illustrated in the accompanying drawings.

DETAILED DESCRIPTION OF THE INVENTION

Figure 1:
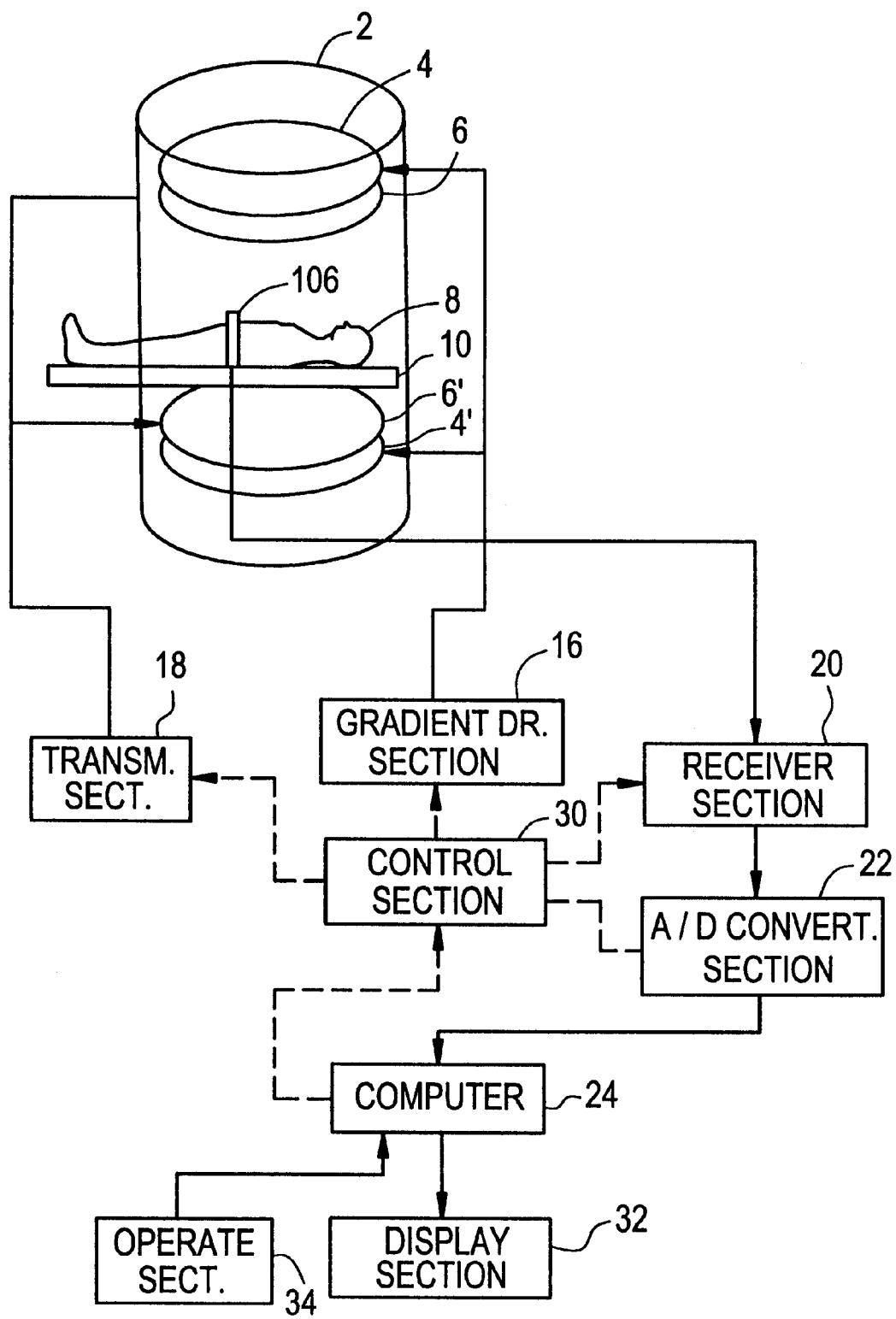
FIG. 1 is a block diagram of an apparatus in accordance with one embodiment of the present invention.

The embodiments of the present invention will now be described in more detail with reference to the accompanying drawings. FIG. 1 shows a block diagram of a magnetic resonance imaging. apparatus, which is one embodiment of the present invention. The configuration of the apparatus represents an embodiment of the apparatus in accordance with the present invention, and the operation of the apparatus represents an embodiment of the method in accordance with the present invention.

As shown in FIG. 1, the apparatus comprises a static magnetic field generating section 2 that generates a homogeneous static magnetic field in its internal space. The static magnetic field generating section 2 comprises a pair of magnetism generators (not shown), such as permanent magnets, which face each other in the vertical direction in the drawing with a certain spacing, generating the static magnetic field (vertical magnetic field) within the interposed space. It would be easily recognized that the magnetism generator is not limited to the permanent magnet but may be a superconductive electromagnet, a normal conductive electromagnet or the like.

Within the internal space of the static magnetic field generating section 2 are disposed gradient coil sections 4, 4' and transmit coil sections 6, 6' facing each other likewise in the vertical direction with a certain spacing. The transmit coil sections 6 and 6' together represent an embodiment of the RF coil of the present invention. Description on the transmit coil sections 6 and 6' will be made later.

A subject 8 is placed on an imaging table 10 and carried into or out of a space interposed between the opposing transmit coil sections 6 and 6' by carrying means (not shown). The body axis of the subject 8 is orthogonal to the direction of the static magnetic field. The imaging table 10 is attached with a receive coil section 106 surrounding an imaging site of the subject 8. The receive coil section 106 is one for imaging the L-spine (lumbar spine), for example, and is attached enveloping the hip of the subject 8. It should be noted that the receive coil section 106 may be disposed not only around the L-spine but also at any position corresponding to a desired imaging site.

The gradient coil sections 4 and 4' are connected with a gradient driving section 16. The gradient driving section 16 supplies the gradient coil sections 4 and 4' with a drive signal to generate gradient magnetic fields. The gradient magnetic fields to be generated are following three: a slice gradient magnetic field, a readout gradient magnetic field and a phase-encoding gradient magnetic field.

The transmit coil sections 6 and 6' are connected with a transmitter section 18. The transmitter section 18 supplies the transmit coil sections 6 and 6' with a drive signal to generate an RF magnetic field, thereby exiting spins within the subject 8.

The receive coil section 106 receives a magnetic resonance signal generated by the excited spins within the subject 8. The receive coil section 106 is connected to the input side of a receiver section 20 and inputs the received signal to the receiver section 20.

The output side of the receiver section 20 is connected to the input side of an analog-to-digital (A-D) converter section 22. The A-D converter section 22 converts an output signal of the receiver section 20 into a digital signal. The output side of the A-D converter section 22 is connected to a computer 24.

The computer 24 receives the digital signal from the A-D converter section 22 and stores it into a memory (not shown).

In the memory is formed a data space that constitutes a Fourier space. The computer 24 performs an inverse Fourier transformation on the data in the Fourier space to reconstruct an image of the subject 8.

The computer 24 is connected to a control section 30, which is in turn connected to the gradient driving section 16, the transmitter section 18, the receiver section 20 and the A-D converter section 22. The control section 30 controls the gradient driving section 16, the transmitter section 18, the receiver section 20 and the A-D converter section 22 based on instructions supplied from the computer 24 to perform magnetic resonance imaging.

The computer 24 is connected with a display section 32 that displays the reconstructed image and several information output from the computer 24, and an operating section 34 that is operated by a human operator inputting several commands and information to the computer 24.

Figure 2:
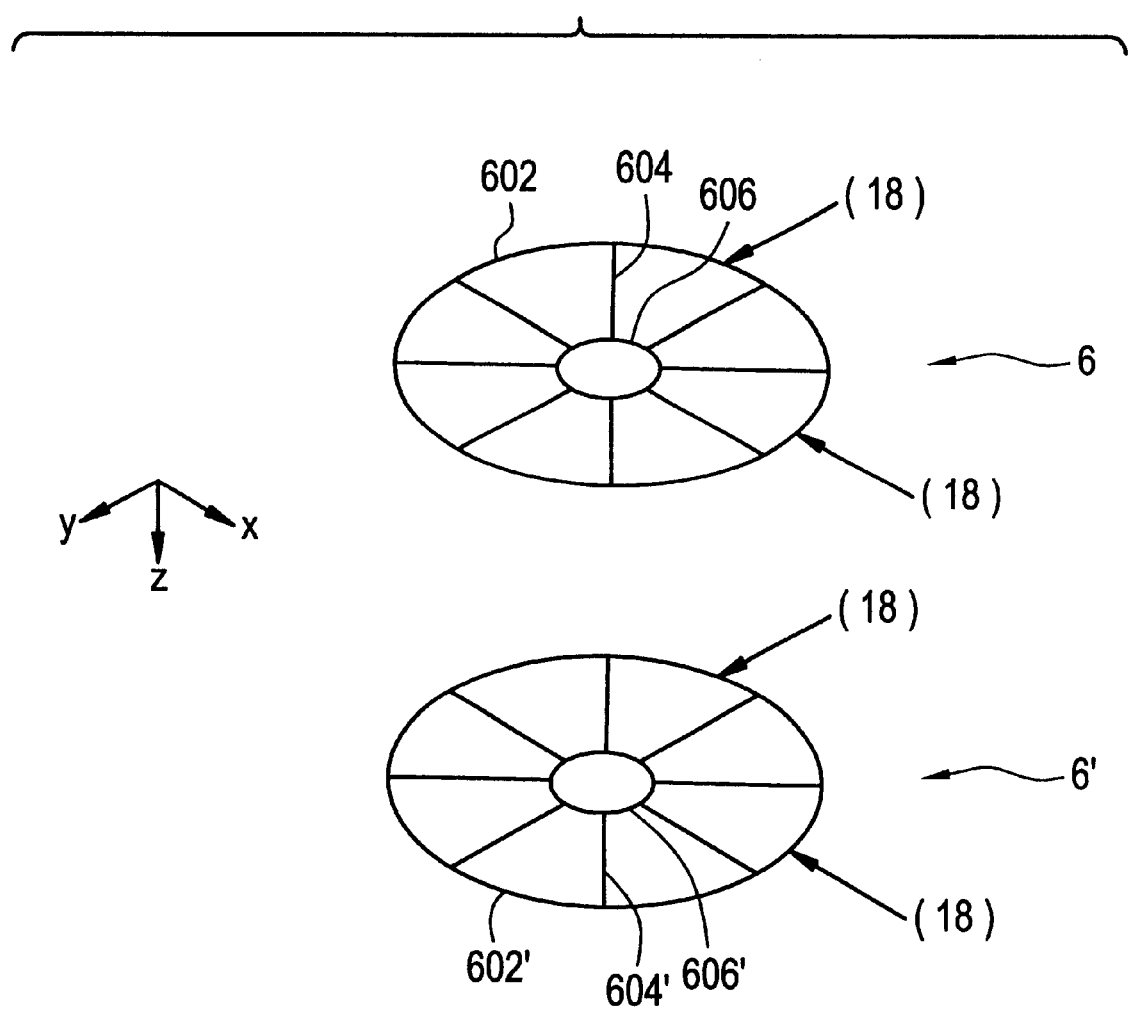
FIG. 2 is a schematic showing the configuration of a transmit coil section in the apparatus of FIG. 1.

FIG. 2 schematically shows the configuration of the transmit coil sections 6 and 6'. FIG. 2 illustrates the three-dimensional structure of an RF coil that constitutes a main portion of the transmit coil sections 6 and 6'. Three mutually orthogonal directions in the three-dimensional space is designated as x, y and z. The z-direction corresponds to the direction of the static magnetic field. As shown, the transmit coil section 6 has electric paths formed on an x-y plane, and the transmit coil section 6' has electric paths formed on another x-y plane spaced apart from the former one in the z-direction.

The transmit coil section 6 has an annular electric path 602. The electric path 602 represents one embodiment of the first electric path of the present invention. Inside the annular electric path 602 are disposed a plurality of electric paths 604 radially extending from a central portion. The number of the radial electric paths 604 is eight, for example. However, the number of the electric paths 604 is not limited to eight but may be any integer multiple of four. It should be noted that designation for the electric paths 604 is represented by the reference numeral at one position in the drawing.

Each of the electric paths 604 has one end connected to the electric path 602, and the other end connected to a central annular electric path 606.

Two positions on the electric path 602 that are 90° apart from each other with respect to the direction as viewed from the inner center are supplied with respective RF signals from the transmitter section 18. The RF signals supplied to these two positions have phases different from each other by 90°.

The transmit coil section 6' has an annular electric path 602'. Inside the annular electric path 602' are provided a plurality of electric paths 604' radially extending from a central portion. The number of the radial electric paths 604' is eight, for example. Again, the number of the electric paths 604' is not limited to eight but may be any integer multiple of four. It should be noted that designation for the electric paths 604' is represented by the reference numeral at one position in the drawing.

Each of the electric paths 604' has one end connected to the electric path 602', and the other end connected to a central annular electric path 606'.

Two positions on the electric path 602' that are 90° apart from each other with respect to the direction as viewed from the inner center are supplied with respective RF signals from the transmitter section 18. The RF signals supplied to these two positions have phases different from each other by 90°.

Figure 3:
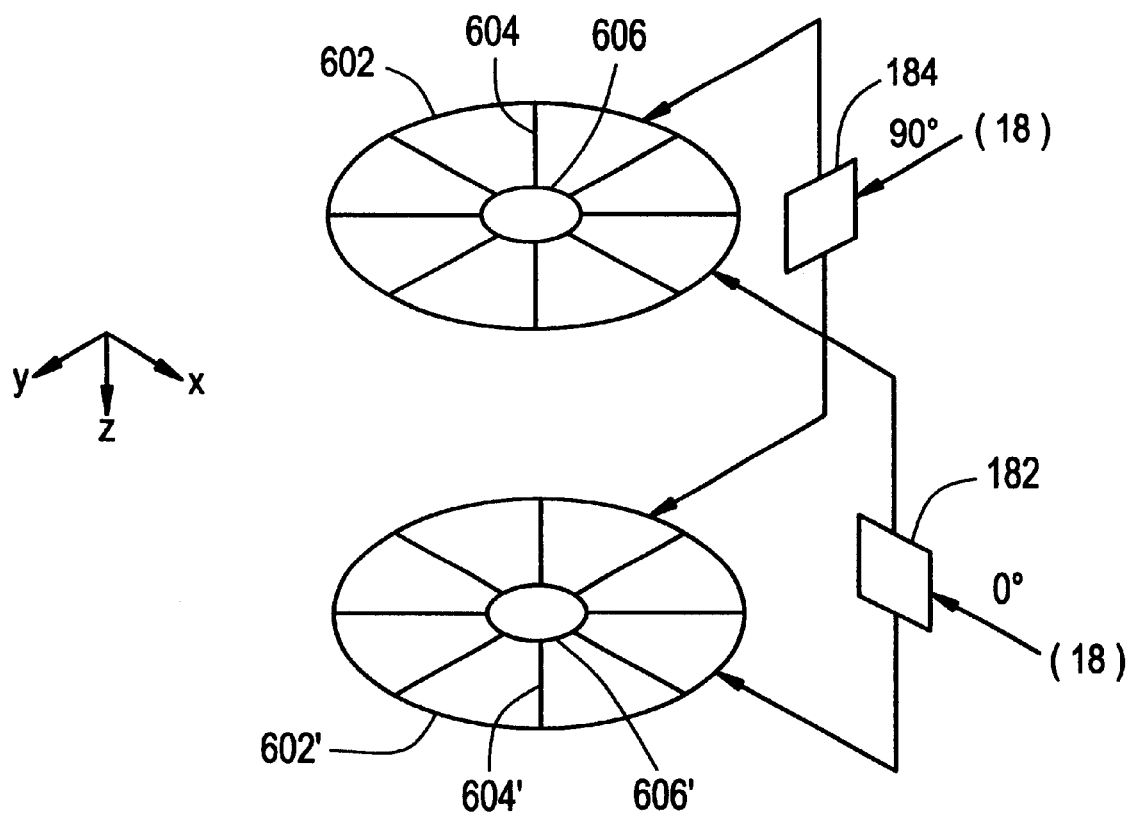
FIG. 3 is a schematic showing the configuration of the transmit coil section in the apparatus of FIG. 1.

Such transmit coil sections 6 and 6' face each other in a mirror-image relationship to constitute the RF coil of the present apparatus. The RF signal supply to the transmit coil sections 6 and 6' is performed by sending two RF signals that have phases different from each other by 90° from the transmitter section 18, and dividing the RF signals equally in power by respective power splitters 182 and 184, as exemplarily shown in FIG. 3. Such supply of the RF signals is preferable in RF-driving the transmit coil sections 6 and 6' under the exactly identical condition. It should be noted that respective power amplifiers may be disposed as necessary between the splitters 182 and 184 and the transmit coil sections 6 and 6'.

Since the RF signals having the same power and the same phase are thus simultaneously supplied to the two opposite coil loops from a common signal source, electromagnetic coupling between the coils is immaterial. In addition, electrostatic coupling between the coils is immaterial because the distance between the coils is sufficiently large. Thus, an RF coil having an excellent frequency property can be obtained.

Signal lines to supply the RF signals to the coils may be made from an appropriate signal line such as a concentric cable, and the lines can be led unrestrictedly. Therefore, it is easy to handle the signal lines without obstructing the subject 8 carried into the magnetic field space, and openness of the magnetic field space is not inhibited.

Figure 4:
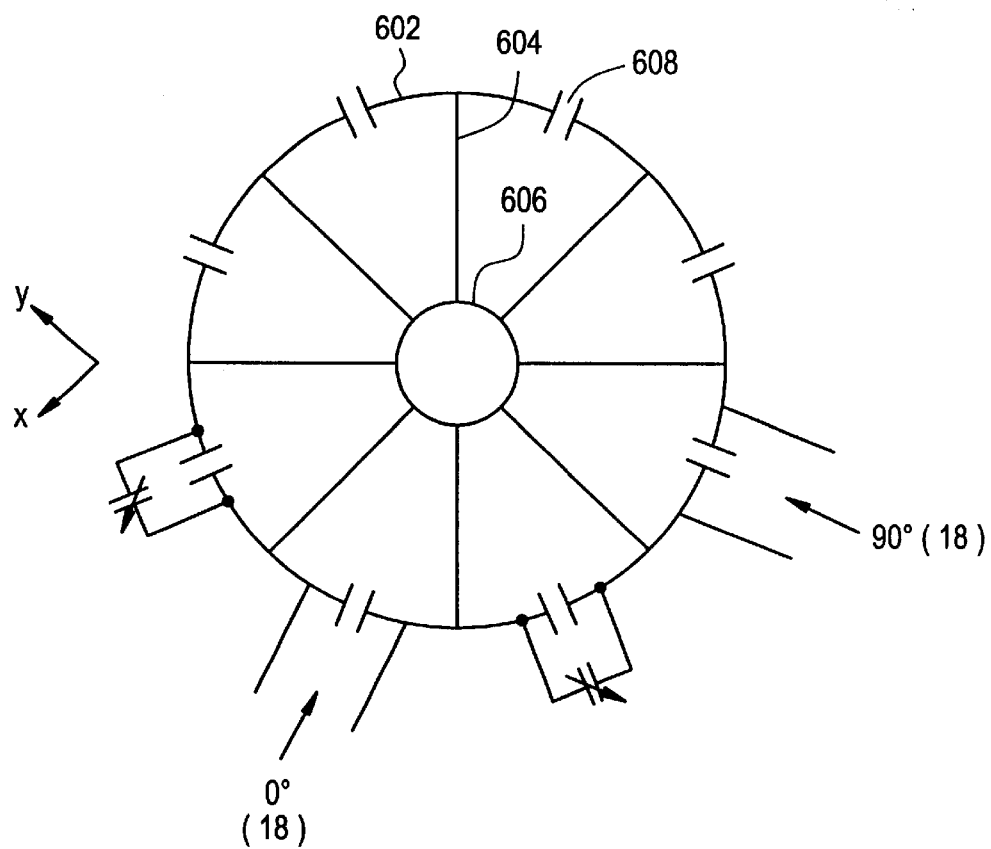
FIG. 4 illustrates an electric circuit of the transmit coil section in the apparatus of FIG. 1.

The electric circuit of the transmit coil section 6 is shown in FIG. 4. As shown, the annular electric path 602 partitioned by the radial electric paths 604 into subsections has respective capacitors 608 connected in series in the subsections. It should be noted that designation for the capacitors 608 is represented by the reference numeral at one position in the drawing. Some of the capacitors are connected in parallel with respective variable capacitors for adjusting the capacitance. The variable capacitors are used to precisely adjust orthogonality between a phase of 0° and a phase of 90°.

The RF signals having phases of 0° and 90° are applied from the transmitter section 18 to both ends of the respective capacitors 608 that are disposed in two subsections 90° apart from each other with respect to the direction from the center.

Figure 5:
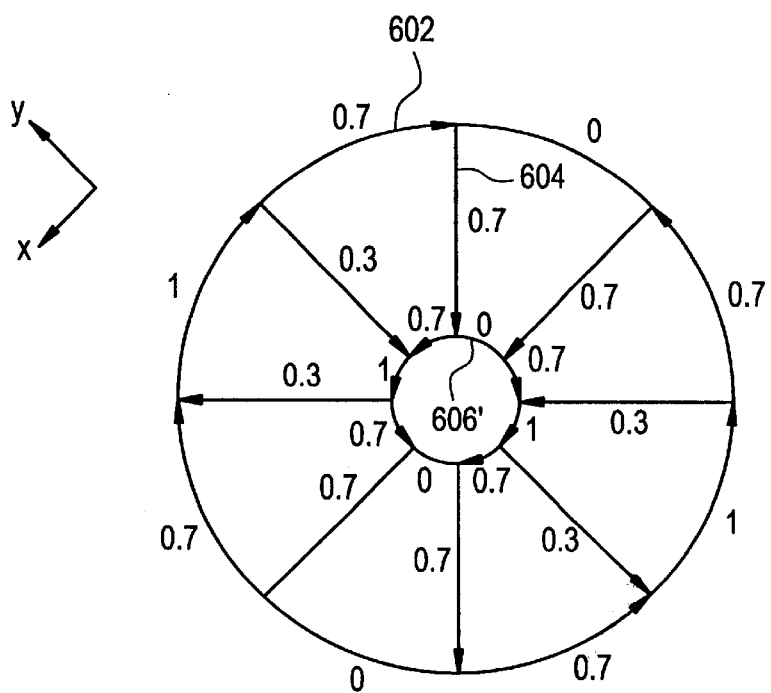
FIG. 5 illustrates an electric distribution in the transmit coil section in the apparatus of FIG. 1.

Now consider the RF signal having a phase of 020 . The proportions of the electric currents flowing through the electric paths are shown in FIG. 5. Specifically, in the outer annular electric path 602, a subsection to which the RF signal is supplied and a subsection opposite thereto have an electric current proportion of 0, two subsections that are 90° apart from the above two subsections with respect to the direction have an electric current proportion of 1, and the remaining subsections have an electric current proportion of 0.7. The subsections in the inner annular electric path 606 have respective electric current proportions similar to those in the corresponding subsections of the outer electric path 602.

In the radial electric paths 604, the electric current proportions are 0.7 for four electric paths lying on both sides of the two subsections in the annular electric path 602 that have an electric current proportion of 0, and the electric current proportions are 0.3 for four electric paths lying on both sides of the two subsections in the annular electric path 602 that have an electric current proportion of 1.

At one polarity of the RF signal, the electric current directions in the electric paths are those indicated by arrows in FIG. 5. Specifically, in the outer annular electric path 602, the electric currents flow counterclockwise and clockwise respectively on the right and left sides in the drawing relative to the subsections having an electric current proportion of 0, and in the inner annular electric path 606, the electric currents flow inversely to the directions in the outer annular electric path 602. In the radial electric paths 604, the electric currents bifurcated from the above electric currents flow in the opposite directions for each pair of the electric paths 604 aligned symmetrically relative to the center.

Figure 6:
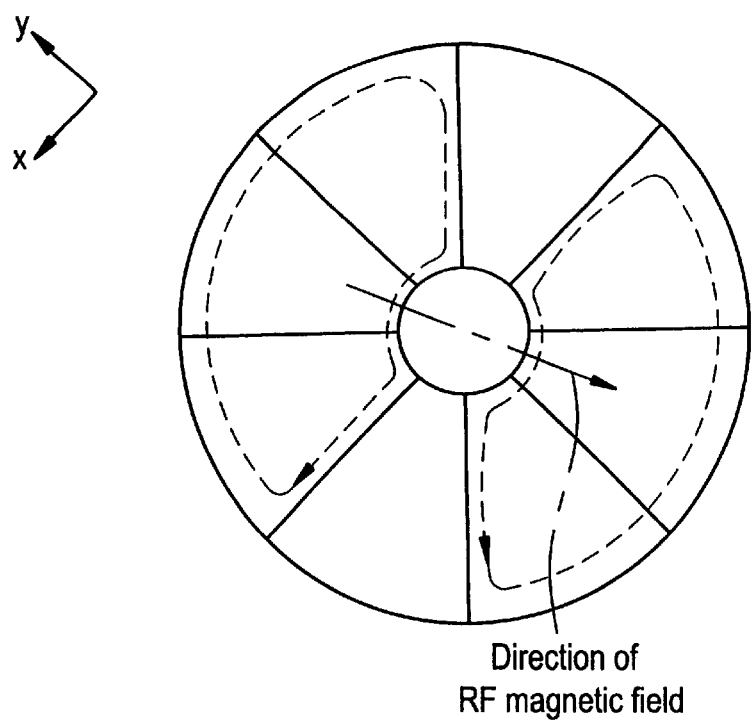
FIG. 6 illustrates an RF magnetic field generated by the transmit coil section in the apparatus of FIG. 1.

Such electric currents generate a magnetic field in the diameter direction perpendicular to the electric paths having an electric current proportion of 1, as indicated by dot-dash arrow in FIG. 6, on the reverse side of the inner annular electric path 606 in the drawing, i.e., on the side facing the transmit coil section 6'.

At the other polarity of the RF signal, the electric current directions are totally inverted relative to the above-described directions, thereby inverting the magnetic field direction. Thus, the transmit coil section 6 generates an RF magnetic field corresponding to the RF signal.

Figure 7:
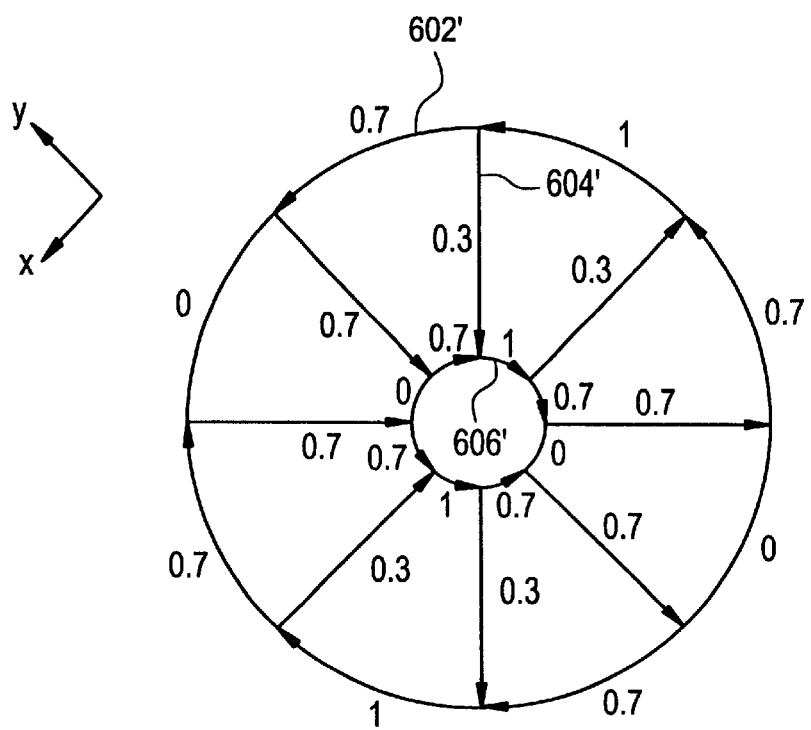
FIG. 7 illustrates an electric distribution in the transmit coil section in the apparatus of FIG. 1.
Figure 8:
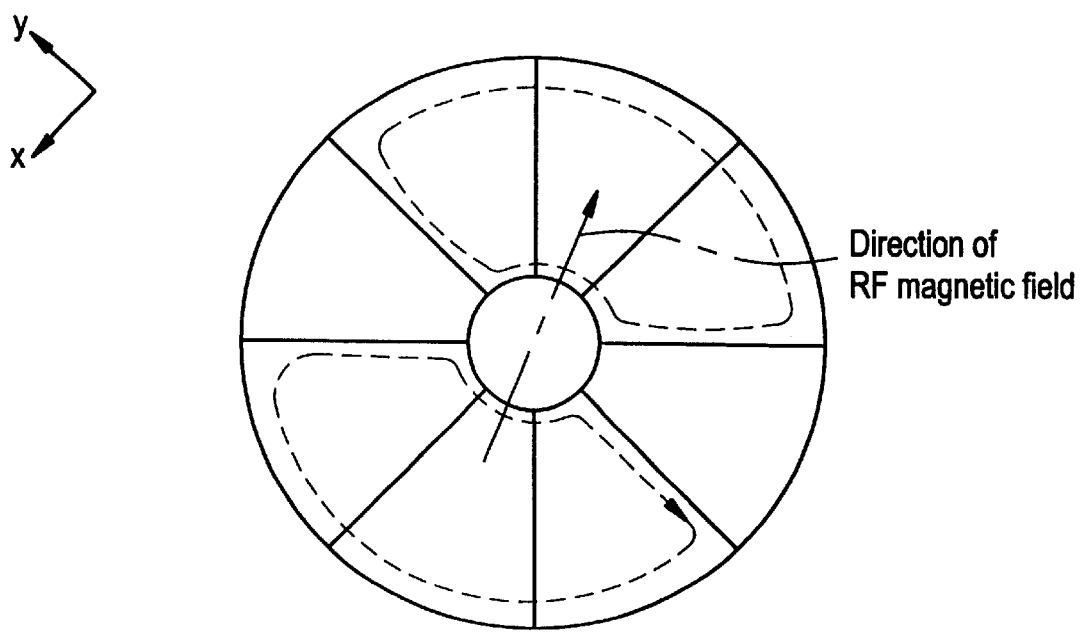
FIG. 8 illustrates an RF magnetic field generated by the transmit coil section in the apparatus of FIG. 1.

Considering the electric currents having a phase of 90°, at one polarity of the RF signal, the electric current proportions of the electric paths are those shown in FIG. 7. Because the RF signal supply position is spatially apart from the supply position for the RF signal having a phase of 0° by 90°, FIG. 7 is identical to FIG. 5 rotated counterclockwise by 90°. Accordingly, the RF magnetic field direction is the same as that shown in FIG. 6 rotated counterclockwise by 90°, as indicated by dot-dash arrow in FIG. 8.

The transmit coil section 6 generates an RF magnetic field as a resultant vector of the above two RF magnetic fields. Since the two RF magnetic fields have a phase difference of 90°, the resultant RF magnetic field becomes a rotary magnetic field that rotates at the frequency of the RF signal. Thus, the transmit coil section 6 acts as a quadrature RF coil.

The transmit coil section 6' has the same circuit configuration and generates a similar rotary magnetic field. However, the electric current directions in the electric paths are totally inverted in the transmit coil section 6' relative to those in the transmit coil section 6 that has a mirror-image relationship to the transmit coil section 6'. Such inversion of the electric current directions can be easily achieved by, for example, inverting the connections of the signal lines connected to both ends of the capacitors 608. In this case, an RF magnetic field generated immediately above the inner annular electric path 606', i.e., generated on the side facing the transmit coil section 6, has the same direction as the direction of the aforementioned magnetic field generated from the transmit coil section 6, thereby forming an RF magnetic field by summing these magnetic fields.

Figure 9:
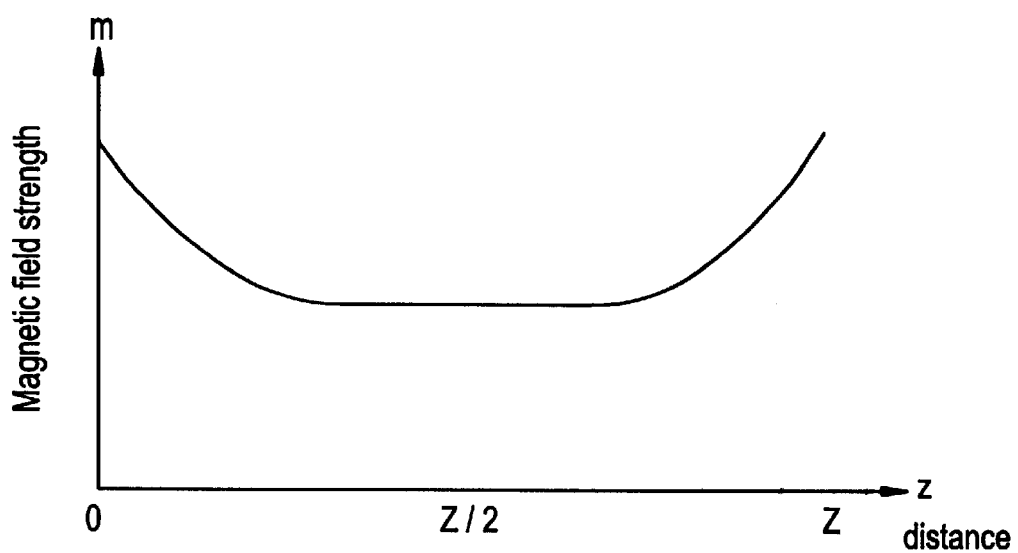
FIG. 9 illustrates a strength distribution of an RF magnetic field generated by the transmit coil section in the apparatus of FIG. 1.

Thus, an RF magnetic field are generated rotating in a plane perpendicular to the z-direction in a space between the transmit coil sections 6 and 6'. As exemplarily shown in FIG. 9, the intensity profile of the RF magnetic field in the z-direction has homogeneity in a wide range containing the center of the static magnetic field (Z/2) by summing up the RF magnetic fields generated from the two coils.

Figure 10:
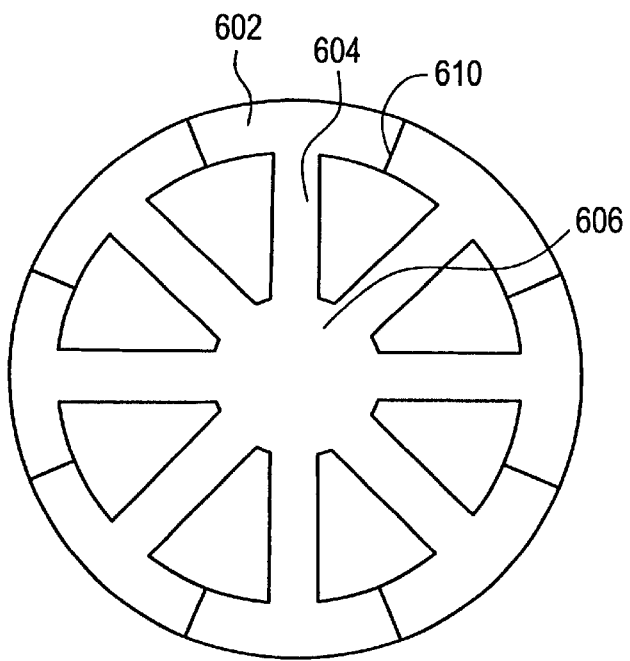
FIG. 10 illustrates an exemplary electric path pattern in the transmit coil section in the apparatus of FIG. 1.

The electric paths of the transmit coil sections 6 and 6' is constructed from a conductive foil, for example. An exemplary circuit pattern of the transmit coil section 6 constructed from the conductive foil is shown in FIG. 10. As shown, all of the electric paths 602, 604 and 606 are constructed from a conductive material such as a copper foil. The thickness of the copper foil is in the range of about 10–100 micrometers, for example. The width of the electric paths 602 and 604 is about a few centimeters or ten or more centimeters, for example.

The annular electric path 602 has respective slits 610 in the subsections, and the capacitors 608 are disposed within the slits 610 for connecting the electric path 602 in series. It should be noted that the capacitors 608 are omitted in FIG. 10. In addition, designation for the slits 610 is represented by the reference numeral at one position in the drawing.

By constructing the radial electric paths 604 as electric passages having a large width, the ratio of a portion between the adjacent electric paths 604 that does not carry electric current can be significantly reduced as compared to the electric paths 604 constructed from a wire. This can mitigate reduction in the magnetic field strength in the intermediate portion between the adjacent electric paths 604, thereby mitigating the degree of inhomogeneity of the magnetic field strength distribution.

The electric path 606 is not constructed as an annulus as described above but as a disk with its central portion closed. Since the electric current flows distributed over the entire disk, unlike the annulus, reduction of the magnetic field at the central portion due to the absence of electric current at the central portion can be avoided, resulting in proper magnetic field generation.

Such circuit pattern is constructed on a support plate composed of any suitable insulating material such as plastic. In this case, one surface of the support plate is provided with the coil pattern and the other surface is provided with a conductive foil for RF shielding. The side on which the coil pattern is disposed is the side that faces the subject 8, and the side on which the RF shield is disposed is the side that faces the gradient coil section 4.

As the support plate, a plate having a thickness of 10 or more millimeters, for example, is used in order to provide a required mechanical strength. Such thickness of the support plate serves to accommodate a disable circuit for preventing coupling of the transmit coil sections 6 and 6' during the operation of the receive coil section 106.

Figure 11B:
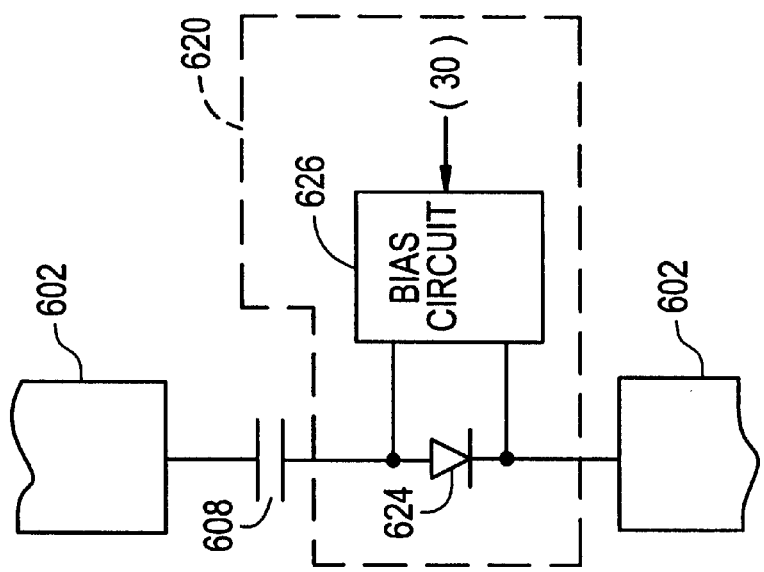
FIGS. 11(a) and 11(b) are a circuit diagram of a disable circuit.
Figure 11A:
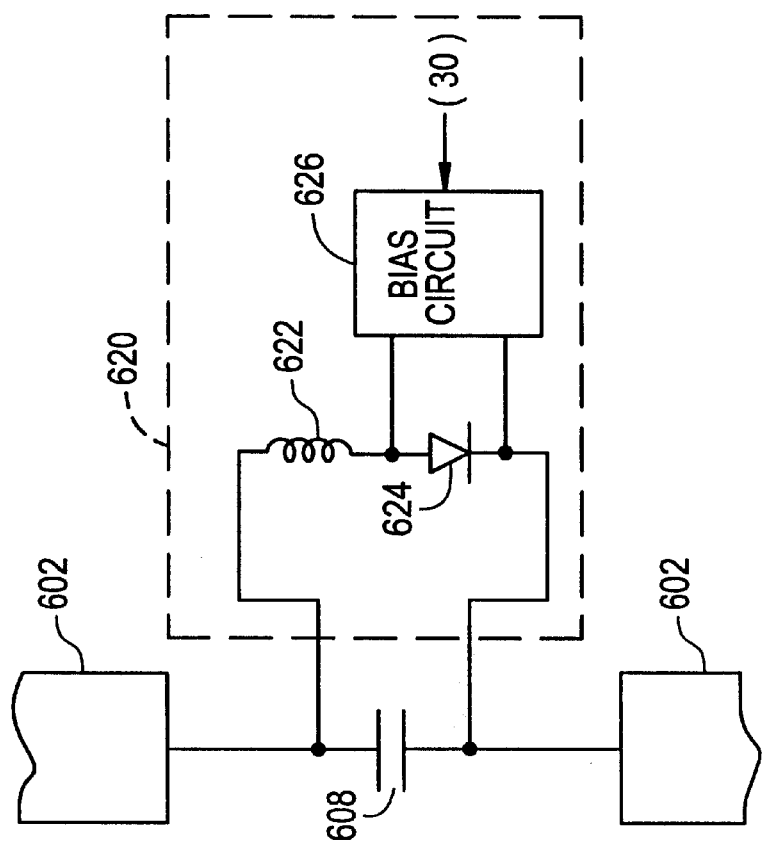

With respect to the disable circuit, a disable circuit 620 exemplarily shown in FIG. 11(*a*) or FIG. 11(*b*) is employed. In FIG. 11(*a*), an inductor 622 that constitutes a parallel resonant circuit along with the capacitor 608 is connected with a diode 624 in series, to which a bias signal is applied from a bias circuit 626. The bias circuit 626 is controlled by the control section 30.

In such circuit configuration, when a forward bias is applied to the diode 624 to make the diode 624 fully ON, the diode 624 loses its rectifying action, thereby forming a parallel resonant circuit, and decoupling with the receive coil section 106 is achieved by a high impedance which the parallel resonant circuit exhibits. It should be noted that when RF excitation is to be performed, no bias is applied to the diode 624. In this case, the parallel resonance does not occur because of the rectifying action of the diode 624.

On the other hand, in a circuit shown in FIG. 11(b), a bias signal is given to the diode 624 connected to the capacitor 608 in series from the bias circuit 626. When no bias is applied to the diode 624, an RF current is blocked due to the diode's rectifying action, thereby achieving decoupling. When the RF excitation is to be performed, the diode is made fully ON by a forward bias, allowing the RF current to flow through.

Figure 12:
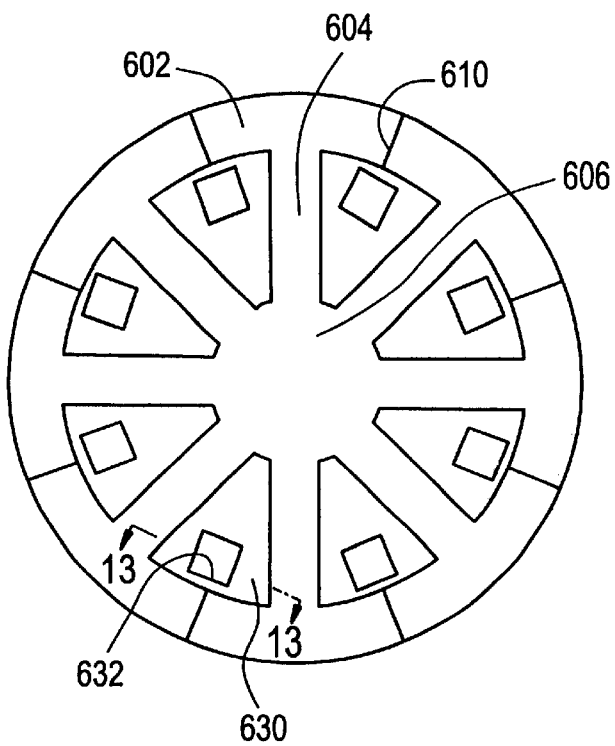
FIG. 12 is a schematic showing the configuration of the transmit coil section in the apparatus of FIG. 1.

FIG. 12 schematically illustrates the configuration of an exemplary RF coil supporting the disable circuit 620. As shown, a support plate 630 provided with a coil pattern is hollowed out between the radial electric paths 604 to form a plurality of concave portions 632, and the disable circuit 620 is put into each of the concave portions 632. The disable circuit 620 is provided for each of the capacitors 608 within the slits 610. It should be noted that designation for the concave portions 632 is represented by the reference numeral at one position in the drawing.

Figure 13:
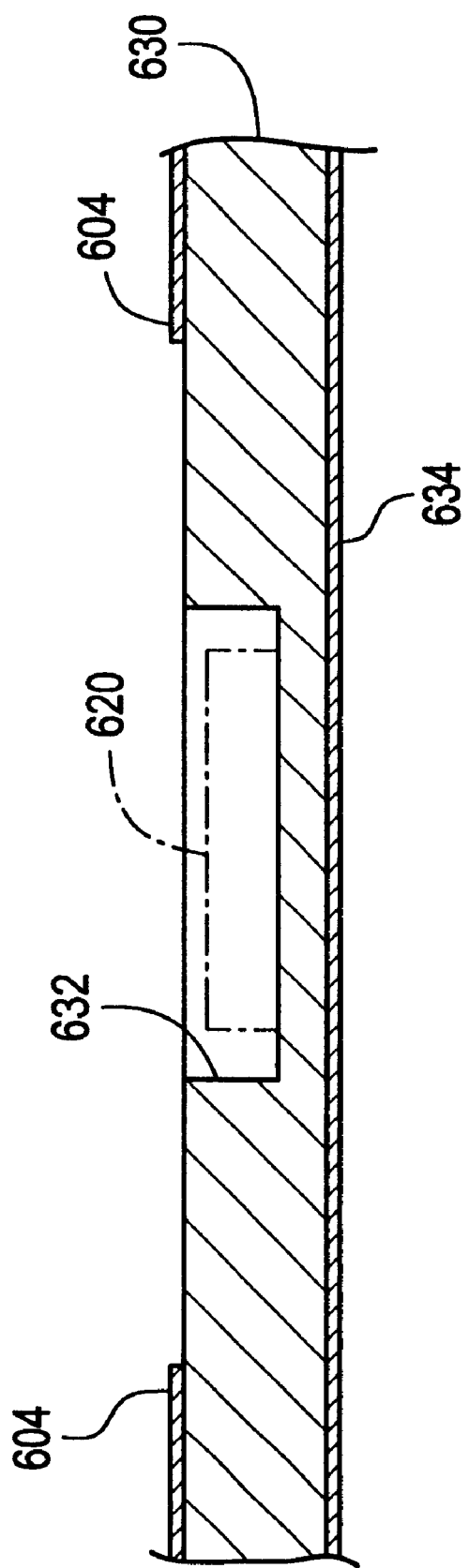
FIG. 13 is a schematic showing the configuration of part of the transmit coil section in the apparatus of FIG. 1.

A cross section taken along line A—A in proximity of the concave portion 632 is shown in FIG. 13. As shown, the concave portion 632 is formed by hollowing out the support plate 630 to an appropriate depth, and the disable circuit 620 constructed on a print circuit board, for example, is put into the concave portion 632. The other side of the support plate 630 is provided with an RF shield 634.

Thus, an RF coil comprising a disable circuit for decoupling is obtained. Since the disable circuit is absorbed in the thickness of the support plate for the coil pattern, an RF coil having a simple shape without any outward protrusions or the like can be obtained.

Now the operation of the present apparatus will be described. The operation of the apparatus proceeds under the control of the control section 30. As an exemplary magnetic resonance imaging procedure, imaging with a gradient echo technique will be referred to. It should be noted that the magnetic resonance imaging is not limited to being performed with the gradient echo technique but may be performed with any other appropriate technique such as a spin echo or EPI (echo-planar imaging) technique.

In imaging with the gradient echo technique, a pulse sequence such as that exemplarily shown in FIG. 14(A)–14(D) is employed. The pulse sequence proceeds from the left to the right along a time axis 't'. The execution of the pulse sequence is controlled by the control section 30.

Figure 14A:
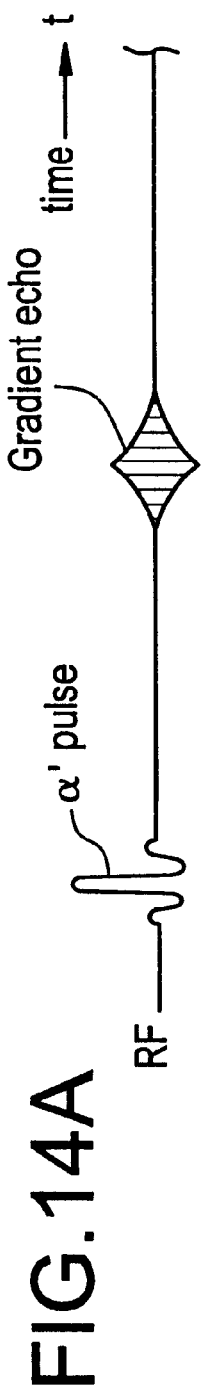
FIGS. 14(a)–14(b) are a schematic showing an exemplary pulse sequence for magnetic resonance imaging.
Figure 14B:
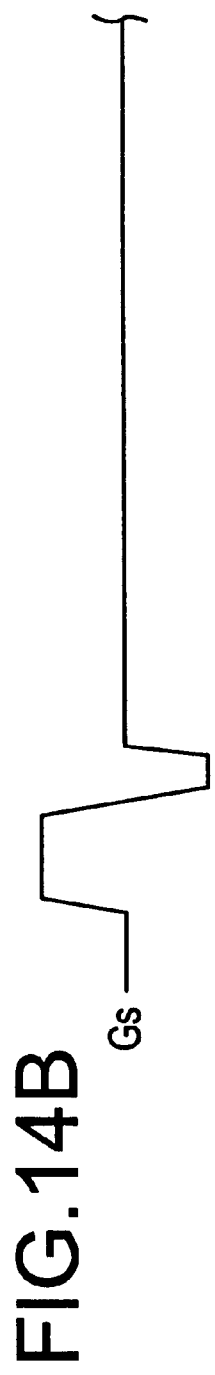
Figure 14C:
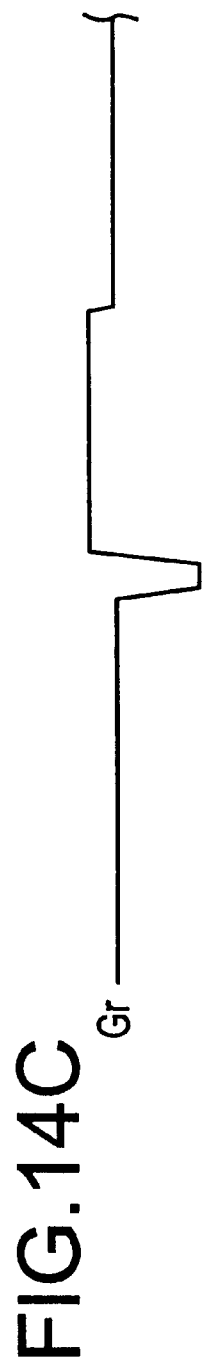

As shown in FIG. 14(A), an RF excitation is performed with an α° pulse. The RF excitation is performed with a good homogeneity over a wide range by the RF coil configuration as described hereinabove. In the RF excitation, a slice gradient magnetic field Gs is applied as shown in FIG. 14(B). Spins in a predetermined site in the subject 8 are thus selectively excited. Following the selective excitation, the spins are rephased by the gradient magnetic field Gs.

Figure 14D:
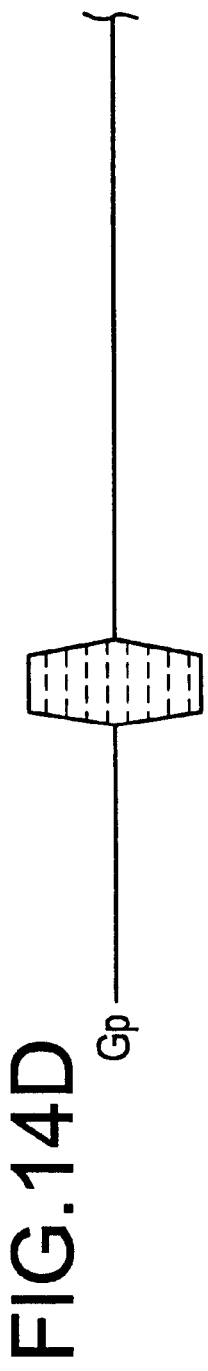

Next, phase encoding is performed by a phase encoding gradient magnetic field Gp as shown in FIG.14(D). Then, the spins are dephased by a readout gradient magnetic field Gr, and subsequently the polarity of the gradient magnetic field is inverted to read out a magnetic resonance signal (gradient echo).

By repeating such pulse sequence in a predetermined repetition time TR, each respective gradient echo is acquired. The magnitude of the phase encoding gradient magnetic field Gp is varied for each TR, and the magnetic resonance signals for a plurality of views are collected in a memory. The computer 24 performs a two-dimensional inverse Fourier transformation on the data collected in the memory and produces a tomographic image of the imaging site. The tomographic image is displayed at the display section 32. Because the RF excitation is performed with a good homogeneity over a wide range, the homogeneity in brightness of the image is improved.

Many widely different embodiments of the invention may be configured without departing from the spirit and the scope of the present invention. It should be understood that the present invention is not limited to the specific embodiments described in the specification, except as defined in the appended claims.

What is claimed is:

1. A magnetic field generating apparatus comprising:

a first planar circular coil; and a second planar circular coil disposed coaxial of and parallel to said first planar circular coil; wherein said first and second planar circular coils each comprise:
a first electric path forming an outer annular closed loop;
a second electric path forming an inner annular closed loop; and
a plurality of third electric paths radially extending from said inner annular closed loop to said outer annular closed loop; and wherein
each of said first electric paths has a pair of terminals for application of RF signals thereto so that said RF signals are split to travel through said plurality of third electric paths and through said second electric path thereby to produce magnetic field by quadrature electric paths without coupling between said first and second planar circular coils.

2. The apparatus of claim 1, further comprising:

means for supplying first RF signals, respectively, to a first terminal on said outer annular closed loop of each of said first and second planar circular coils and for supplying second RF signals, which are 90° different in phase from said first RF signals, respectively, to a second terminal on said outer annular closed loop of each of said first and second planar circular coils, said first and second terminals being 90° apart as viewed axially of the first and second planar circular coils.

3. A magnetic resonance imaging apparatus comprising:

means for generating a static magnetic field in a Z-direction, wherein three mutually orthogonal directions are defined as an X-direction, a Y-direction, and a Z-direction in a space accommodating a subject under study;

means for generating a gradient magnetic field in said space;

means for generating a high frequency magnetic field in said space;

means for measuring a magnetic resonance signal from said space; and means for producing an image based on the magnetic resonance signal measured by said means for measuring; wherein said means for generating a high frequency- magnetic field comprises:

a first planar circular coil;

a second planar circular coil disposed coaxial of and parallel to said first planar circular coil; wherein said first and second planar circular coils each comprises:

a first electric path forming an outer annular closed loop;

a second electric path forming an inner annular closed loop; and a plurality of third electric paths radially extending from said inner annular closed loop to said outer annular closed loop; and wherein each of said first electric paths has a pair of terminals for application of RF signals thereto so that said RF signals are split to travel through said plurality of third electric paths and through said second electric path thereby to produce magnetic field by quadrature electric paths without coupling between said first and second planar circular coils; and means for supplying first RF signals, respectively, to a first terminal on said outer annular closed loop of each of said first and second planar circular coils and for supplying second RF signals, which are 90° different in phase from said first RF signals, respectively, to a second terminal on said outer annular closed loop of each of said first and second planar circular coils, said first and second terminals being 90° apart as viewed axially of the first and second planar circular coils.

4. A magnetic resonance imaging method comprising the steps of:

generating a static magnetic field in a Z-direction, wherein three mutually orthogonal directions are defined as a Y-direction, an X-direction, and a Z-direction in a space accommodating a subject under study;

generating a gradient magnetic field in said space;

generating a high frequency magnetic field in said space;

measuring a magnetic resonance signal from said space; and producing an image based on the magnetic resonance signal measured by said measuring step; wherein said step of generating a high frequency magnetic field is performed using a magnetic field generating apparatus comprising:

a first planar circular coil;

a second planar circular coil disposed coaxial of and parallel to said first planar circular coil; wherein said first and second planar circular coils each comprise:

a first electric path forming an outer annular closed loop;

a second electric path forming an inner annular closed loop; and a plurality of third electric paths radially extending from said inner closed loop to said outer annular closed loop; and wherein each of said first electric paths has a pair of terminals for application of RF signals thereto so that said RF signal are split to travel through said purality of third electric paths and through said second electric path thereby to produce magnetic field by quadrature electric paths without coupling between said first and second planar circular coils; and means for supplying first RF signals, respectively, to a first terminal on said outer annular closed loop of each of said first and second planar circular coils and for supply second RF signals, which are 90° different in phase from said first RF signals, respectively, to a second terminal on said outer annular closed loop of each of said first and second planar circular coils, said first and second terminals being 90° apart as viewed axially of the first and second planar circular coils.

5. The apparatus of claim 1, wherein said plurality of third electric paths comprise a number 4N, wherein N is an integer.

6. The apparatus of claim 1, wherein RF signals are supplied by a concentric cable.

7. The apparatus of claim 1, wherein said outer annular closed loop is divided into a plurality of subsections with a capacitor connecting adjacent subsections.

8. The apparatus of claim 2, wherein RF magnetic fields are generated in said first and second planar circular coils and rotate at a frequency of the RF signals applied thereto.

9. The apparatus of claim 3, wherein RF magnetic fields are generated in said first and second planar circular coils and rotate at a frequency of the RF signals applied thereto.

10. The apparatus of claim 2, wherein RF magnetic fields generated in said first and second planar circular coils are summed.

11. The apparatus of claim 3, wherein RF magnetic fields generated in said first and second planar circular coils are summed.

12. The apparatus of claim 1, wherein said first and second planar circular coils are formed of conductive foil.

13. The apparatus of claim 12, wherein said conductive foil has a thickness of 10 to 100 micrometers and a width of a few to 10 or more centimeters.

14. The apparatus of claim 7, wherein each of said subsections comprises a slit.

15. The apparatus of claim 1, wherein each of said first and second planar circular coils has a component of large width.

16. The apparatus of claim 1, wherein each of said first and second planar circular coils is disposed on a support plate of a thickness of 10 mm or more.

17. The apparatus of claim 2, wherein each of said first and second planar circular coils is disposed on a support plate of a thickess of 10 or more millimeters.

18. The apparatus of claim 3, wherein each of said first and second planar circular coils is disposed on a support plate of a thickness of 10 mm or more.

19. The apparatus of claim 2, further comprising means for preventing coupling of said first and second planar circular coils during receipt of signals from said space.

20. The apparatus of claim 3, further comprising means for preventing coupling of said first and second planar circular coils during receipt of signals from said space.

* * * * *